United States Patent [19]

Kuo

[11] 4,131,808
[45] Dec. 26, 1978

[54] TTL TO MOS DRIVER CIRCUIT

[75] Inventor: James R. Kuo, Cupertino, Calif.

[73] Assignee: Fairchild Camera and Instrument Corporation, Mountain View, Calif.

[21] Appl. No.: 821,673

[22] Filed: Aug. 4, 1977

[51] Int. Cl.² .................................. H03K 17/00
[52] U.S. Cl. ........................... 307/270; 307/DIG. 1; 307/214; 307/300; 307/315
[58] Field of Search ......... 307/DIG. 1, 270, 214–215, 307/358, 300, 315; 340/662; 58/152 H

[56] References Cited

U.S. PATENT DOCUMENTS

| | | | |
|---|---|---|---|
| 3,980,898 | 9/1976 | Priel | 307/DIG. 1 |
| 4,002,931 | 1/1977 | Tsang et al. | 307/315 |
| 4,023,050 | 5/1977 | Fox et al. | 307/DIG. 1 |

Primary Examiner—Stanley D. Miller, Jr.
Assistant Examiner—B. P. Davis
Attorney, Agent, or Firm—Alan H. MacPherson; Henry K. Woodward; Paul J. Winters

[57] ABSTRACT

A high speed driver for providing high-current and high-voltage output levels suitable for driving MOS circuits, such as MOS RAMs from standard TTL input signals. Novel circuitry in the driver provides very high speed signal switching and a power-saving feature prevents MOS supply current drain by the circuit when TTL power has been turned off.

9 Claims, 1 Drawing Figure

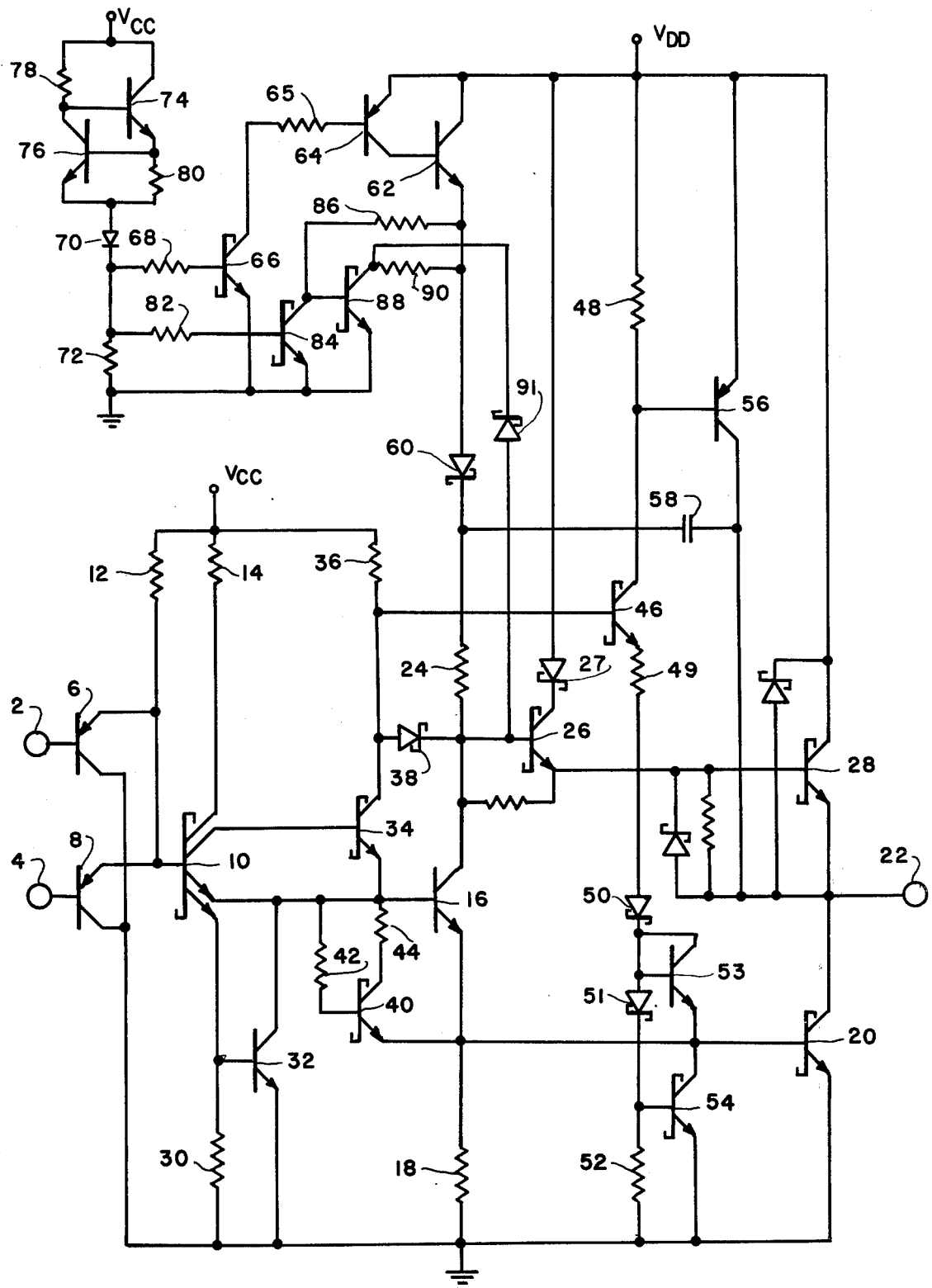

TTL TO MOS DRIVER CIRCUIT

SUMMARY OF THE INVENTION

This invention relates to circuitry for driving MOS circuits, such as random access memories or the like, from TTL control circuitry, and particularly to a TTL to MOS driver containing novel and improved circuitry for improving switching speeds and for eliminating MOS supply current drain when the TTL power supply is off.

The basic circuitry of the TTL to MOS driver is well-known and comprises an input buffer stage operating at TTL voltage levels that controls a phase splitter which, in turn, controls conduction through a pair of output transistors in series between ground potential and MOS high-level supply voltage. Switching of the buffer stage by suitable TTL devices will enable one or the other of the series output transistors and the output, which is taken at the interconnecting point of the two output transistors and the ground potential, will be similarly switched to either the high level or low level MOS potential. While the basic circuit may be adequate for the operation of many MOS devices, it is not acceptable for high-speed MOS memories because of the relatively long transition times required during switching of the transistors. For example, when switching off the relatively large current required by large memory arrays, the conducting transistor may be in saturation so that, upon cutoff, collector current may flow for some period of time required for the minority carriers to be swept clear of the base-collector junction. Thus, for high-speed switching, such as required in the modern day memory applications, the basic TTL to MOS driver circuit must be provided with suitable means to prevent transistor saturation and with other techniques that will rapidly charge and discharge the various components as needed.

When in a standby condition and not actively in use, a volatile MOS memory must be continually energized to retain its stored information. The driver circuit is also coupled to the MOS power source and, under normal standby conditions, would draw a small current from that power source. The circuitry of the invention includes means for eliminating all power drain from the MOS power source when the TTL power source is shut down. Hence, during off periods, the TTL to MOS driver draws negligible current.

BRIEF DESCRIPTION OF THE DRAWING

The single drawing is a schematic diagram of a TTL to MOS driver circuit containing novel circuitry of the invention.

DETAILED DESCRIPTION OF THE PREFERRED EMBODIMENT

Referring now to the drawing, a pair of input terminals 2 and 4 are coupled to the base of PNP transistors 6 and 8, respectively, the emitters of which are connected to the base of an NPN transistor 10 and also through a suitable resistance 12 to the positive source of TTL power. The collectors of transistors 6 and 8 are connected together and to ground potential. The transistors 6 and 8 therefore serve as an input AND-gate which, in a RAM driver circuit, usually receives binary signals representing driver address and strobe.

NPN transistor 10 is a dual-collector dual-emitter Schottky transistor, the first collector of which is connected through a suitable resistance 14 to the positive source of TTL power, and the first emitter of which is connected to the base of NPN transistor 16 which serves as a phase splitter. The emitter of transistor 16 is coupled to ground through a 5K resistor 18 and to the base of an NPN Schottky transistor 20, the emitter of which is connected to ground potential and the collector of which is coupled to the output terminal 22. The collector of transistor 16 is coupled through a 5K resistance 24 to a source of MOS power, as will be subsequently explained, and also to the base of an NPN Schottky transistor 26. The collector of transistor 26 is coupled through a Schottky diode 27 to the positive MOS power source and the emitter is connected to the base of an NPN Schottky transistor 28, the collector of which is coupled to the positive source of MOS power and the emitter of which is connected to the output terminal 22. The diode materially speeds the output rising toward its final $V_{OH}$ level. Transistors 26 and 28 form a Darlington pair, which, together with the transistor 20, form what is generally referred to as an active pull-up output stage.

The circuitry explained thus far comprises a basic TTL to MOS driver which, except for speed advantages provided by the diode 27 and the Schottky transistors, is relatively slow and inefficient. In the preferred embodiment, circuit speed and efficiency is improved as will be subsequently described.

Referring again to the dual-collector dual-emitter input buffer transistor 10, the second emitter is coupled through a suitable resistance 30 to ground and also to the base of an NPN transistor 32, the emitter of which is grounded and the collector of which is connected to the base of transistor 16, thereby providing a low impedance discharge path. The second collector of the transistor 10 is coupled to the base of an NPN Schottky transistor 34, the collector of which is coupled through a resistance 36 to the positive source of TTL power and to the anode of a Schottky diode 38, the cathode of which is connected to the collector of transistor 16. The emitter of transistor 34 is connected to the base of transistor 16. Thus, the phase splitter transistor 16 is clamped by the Schottky diode 38 which prevents the saturation of transistor 16 and permits faster switching times.

The base of transistor 16 is also connected to a squaring circuit comprising an NPN Schottky transistor 40, the base of which is connected through a 450 ohm resistance 42 to the base of transistor 16 and the collector of which is connected through a 130 ohm resistance 44 to the base of transistor 16. Transistor 40 provides a high A.C. impedance and a low D.C. impedance between the base and emitter of the transistor 16 and greatly improves the turn-on speed of the transistor 16. In operation, at the moment that the transistor 10 is cut off, most of the emitter current of transistor 34 is being fed into the base of transistor 16 for rapid turn-on until transistor 40 begins to turn on. After transistor 40 becomes conductive, the majority of the emitter current from transistor 34 will be applied through transistor 40 into the base of the output transistor 20 instead of through the base-collector junction of transistor 16. This results in less stored charges in the base-collector junction of transistor 16 and enables that transistor to rapidly turn off. This turnoff speed is also aided by the initial charging current provided by the Schottky diode 38.

The collector of transistor 34 is also connected to the base of an NPN Schottky transistor 46, the collector of which is connected through a suitable resistance 48 to the positive MOS power source and the emitter of which is coupled to ground through a series circuit comprising resistor 49, Schottky diodes 50 and 51, and resistor 52. The transistor 46 not only provides current to the transistors 54 and 56, as will be described shortly, but serves as an emitter follower with a high input impedance that permits greater conduction of diode 38 and a consequent faster rise time of transistor 26.

The junction of diodes 50 and 51 is connected to the base and collector of a diode connected NPN transistor 53, the emitter of which is connected to the base of output transistor 20. The junction of diode 51 and resistor 52 is connected to the base of an NPN Schottky transistor 54, the collector of which is connected to the base of output transistor 20 and the emitter of which is connected to ground. Transistor 53 is provided to prevent saturation of transistor 54, thereby to maintain the proper threshhold level at the base of transistor 16. Without the benefit of transistor 54, the feedback current through the base-collector junction of transistor 20 may, during a low to high transition, enter a Miller capacitor control mode and require a relatively long discharge time. In the preferred embodiment, transistor 54 becomes conductive during the low to high transistion and rapidly discharges the transistor 20 to decrease the circuit turn-off time.

The collector of transistor 46 is connected to the base of the PNP transistor 56, the emitter of which is connected to the positive MOS potential source and the collector of which is connected to the output terminal 22. The collector of transistor 56 is also connected to one terminal of a 50-microfarad capacitor 58 which, together with the transistors 56 and 28, forms a bootstrap circuit that assists in linearizing the output rise transition and holds the output voltage level as close as possible to the positive MOS potential after discharge of the capacitor 58.

As previously mentioned, a volatile MOS memory must be constantly connected to a positive power source to retain its stored information. While the memory is inactive but still retaining its stored data, peripheral devices, such as the driver circuitry, should not be required to draw current from the MOS power source. The preferred embodiment of the invention includes circuitry that is responsive to a shutdown in the TTL power source to shut off all MOS current to the driver circuitry.

As described previously, the collector of the phase splitter transistor 16 is connected through resistance 24 to the MOS power source. Resistor 24 is connected to the cathode of a Schottky diode 60, the anode of which is connected to the emitter of an NPN transistor 62, the collector of which is connected to the MOS power source. The base of transistor 62 is coupled to the collector of a PNP transistor 64, the emitter of which is connected to the MOS power source. The base of transistor 64 is connected through a resistor 65 to the collector of an NPN Schottky transistor 66, the emitter of which is grounded, and the base of which is coupled through a suitable resistance 68 to the cathode of a diode 70. The anode of diode 70 is connected to the output of a current regulator circuit which is connected from the positive TTL power source through diode 70 and through a 1K resistance 72 to ground. Although other configurations will operate satisfactorily, the current source in the preferred embodiment includes a pair of NPN transistors 74 and 76 in parallel branches with resistances 78 and 80. Thus, the collector of transistor 74 is connected to the positive source and the emitter is connected through resistance 80 to the diode 70. In the other branch, the collector of transistor 76 is connected through resistance 78 to the positive source, and the emitter is connected to the diode 70. The base of transistor 74 is coupled to the collector of transistor 76 and the base of transistor 76 is coupled to the emitter of transistor 74.

The cathode of diode 70 is also connected through a suitable resistance 82 to the base of a Schottky NPN transistor 84, the emitter of which is grounded and the collector of which is connected through a resistance 86 to the emitter of transistor 62 and to the base of a Schottky NPN transistor 88. The emitter of transistor 88 is grounded and the collector is coupled through a resistance 90 to the emitter of transistor 62.

The collector of transistor 88 is also coupled to the cathode of a Schottky diode 91, the anode of which is connected to the base of transistor 26. Diode 91 serves to drain the base of transistor 26 during the short period between the time the TTL supply is shut down and the time that the transistor 62 is turned off, thereby preventing the undesired switching-on of transistor 26 and a false output pulse from transistor 28 after TTL power shut-down.

In operation, when the TTL power source is shut down and the voltage level drops to approximately 3.4 volts, transistors 66 and 84 will become non-conductive. The cutting off of transistor 66 will similarly turn off transistor 64 and the charge stored in transistor 64 will keep transistor 62 on for a short time to supply a base current through resistance 86 to the base of transistor 88, thereby turning on transistor 88. Transistor 88 steers all current from the diode 60 and forces the Darlington transistor 26 and its associated output transistor 28 in their non-conductive state. As soon as the transistor 64 loses all of its stored charge, both transistors 64 and 62 will turn off and prevent any current flow from the MOS power source into the driver circuitry. It will be noted that the shutting down of transistors 34 and 16 will result in turning off the output transistor 20 and that the output of the driver will be forced into a tri-state condition.

Having thus described the preferred embodiment of my invention, what is claimed is:

1. A TTL to MOS driver circuit comprising:
  input circuitry including an input buffer transistor coupled between a TTL power source and ground reference for generating buffer output signals in response to applied binary input signals;
  a phase splitter transistor coupled between a MOS power source and ground and to the emitter of said input buffer transistor, said phase splitter transistor being switched between conductive and nonconductive states in response to said buffer transistor output signals;
  an output stage including first and second output transistors in series between said MOS power source and ground and coupled to said phase splitter transistor, said first output transistor being enabled when said phase splitter transistor is conductive, said second output transistor being enabled when said phase splitter transistor is nonconductive, the interconnection of said first and second output transistors providing the output terminal of said driver; and current control circuitry responsive to a predetermined drop in voltage of said TTL power source for switching off all MOS power in the conductor to said phase splitter transistor and to said output stage, and for instantaneously grounding stored charges in said conductor.

2. The driver circuit claimed in claim 1 wherein said current control circuitry includes voltage sensing circuitry coupled between said TTL power source and ground, and further includes a first control transistor responsive to a predetermined voltage level sensed by said sensing circuitry for turning off a gate transistor coupled between said MOS power source and said phase splitter transistor and said output stage.

3. The driver circuit claimed in claim 2 further including a second control transistor coupled between the output of said gate transistor and ground, said second control transistor being enabled at a level lower than said predetermined voltage level for discharging said gate transistor output circuit.

4. The driver circuit claimed in claim 3 further including a squaring network including a first Schottky transistor coupled between the base and emitter of said phase splitter transistor, said squaring network providing high A.C. and low D.C. impedances between said base and emitter for improving turn-on speed of said phase splitter transistor during signal transitions.

5. The driver circuit claimed in claim 4 further including a second Schottky transistor coupled between said TTL power source and the base of said phase splitter transistor, said second Schottky transistor coupled to a second collector of said input buffer transistor; and further including a first Schottky diode coupled between the emitter of said phase splitter transistor and the collector of said second Schottky transistor for preventing saturation of said phase splitter transistor.

6. The driver circuit claimed in claim 5 further including a bootstrap circuit including a capacitor coupled between said MOS power source and said output terminal for linearizing transitions of rising output signals.

7. The driver circuit claimed in claim 6 further including third and fourth Schottky transistors, said third Schottky transistor coupled between said positive MOS power source and ground and to the collector of said second Schottky transistor, said fourth Schottky transistor coupled between the base of said second output transistor and ground and to the emitter of said third Schottky transistor, said fourth Schottky transistor providing a rapid discharge to the base of said second output transistor upon conduction of said third Schottky transistor.

8. The driver circuit claimed in claim 7 wherein said first output transistor is driven by a fifth Schottky transistor in a Darlington configuration, the base of said fifth transistor being coupled to the collector of said phase splitter transistor and through a third Schottky diode to the collector of said second control transistor for rapid discharge of said fifth Schottky transistor upon shutdown of said TTL power source.

9. The driver circuit claimed in claim 8 wherein the collector of said fifth Schottky transistor is coupled to said MOS power source through a second Schottky diode that speeds output rise time.

* * * * *